United States Patent
Saklang et al.

(10) Patent No.: US 11,114,239 B2
(45) Date of Patent: Sep. 7, 2021

(54) ELECTRONIC DEVICE, DEVICE PACKAGE, AND METHOD OF FABRICATION

(71) Applicant: NXP B.V., Eindhoven (NL)

(72) Inventors: Chayathorn Saklang, Bangplee (TH); Wiwat Tanwongwan, Bangkok (TH); Amornthep Saiyajitara, Bangken (TH); Chanon Suwankasab, Pathumthani (TH)

(73) Assignee: NXP B.V., Eindhoven (NL)

( * ) Notice: Subject to any disclaimer, the term of this patent is extended or adjusted under 35 U.S.C. 154(b) by 30 days.

(21) Appl. No.: 16/689,347

(22) Filed: Nov. 20, 2019

(65) Prior Publication Data

US 2021/0151251 A1    May 20, 2021

(51) Int. Cl.
*H01G 2/06* (2006.01)
*H01L 23/00* (2006.01)
*H05K 3/34* (2006.01)

(52) U.S. Cl.
CPC ............. *H01G 2/065* (2013.01); *H01L 24/05* (2013.01); *H01L 24/48* (2013.01); *H05K 3/3426* (2013.01); *H05K 2201/10636* (2013.01)

(58) Field of Classification Search
CPC ............ H01G 2/065; H01G 2/06; H01G 2/12; H01G 4/38; H01L 23/00; H01L 24/05; H01L 24/48; H05K 3/3426; H05K 3/34; H05K 2201/10636

USPC .................................... 361/301.1, 305
See application file for complete search history.

(56) References Cited

U.S. PATENT DOCUMENTS

| 4,004,200 | A | 1/1977 | Johanson |
| 4,151,579 | A | 4/1979 | Stark |
| 2005/0041367 | A1 | 2/2005 | Yoshii et al. |
| 2005/0128678 | A1* | 6/2005 | Hidaka ..................... H01G 2/12 361/305 |
| 2010/0032825 | A1* | 2/2010 | Elliott ..................... H01L 21/50 257/692 |
| 2017/0033034 | A1* | 2/2017 | Saklang ..................... G01P 3/44 |
| 2020/0075463 | A1* | 3/2020 | Sanchez .................. H01L 21/50 |
| 2020/0194345 | A1* | 6/2020 | Cheng .............. H01L 23/49541 |

\* cited by examiner

*Primary Examiner* — Timothy J Thompson
*Assistant Examiner* — Guillermo J Egoavil

(57) ABSTRACT

A device includes a leadframe and an electronic component. The leadframe includes a first leadframe element having a first surface and a second leadframe element adjacent to the first leadframe element, the first and second leadframe elements being separate from one another, the second leadframe element having a second surface. A first flange extends from a first outer edge of the first leadframe element and extends away from the first surface of the first leadframe element. A second flange extends from a second outer edge of the second leadframe element and extends away from the second surface of the second leadframe element. The electronic component is coupled to the first and second surfaces of the first and second leadframe elements such that the first and second flanges are located at opposing first and second sidewalls of the electronic component.

18 Claims, 3 Drawing Sheets

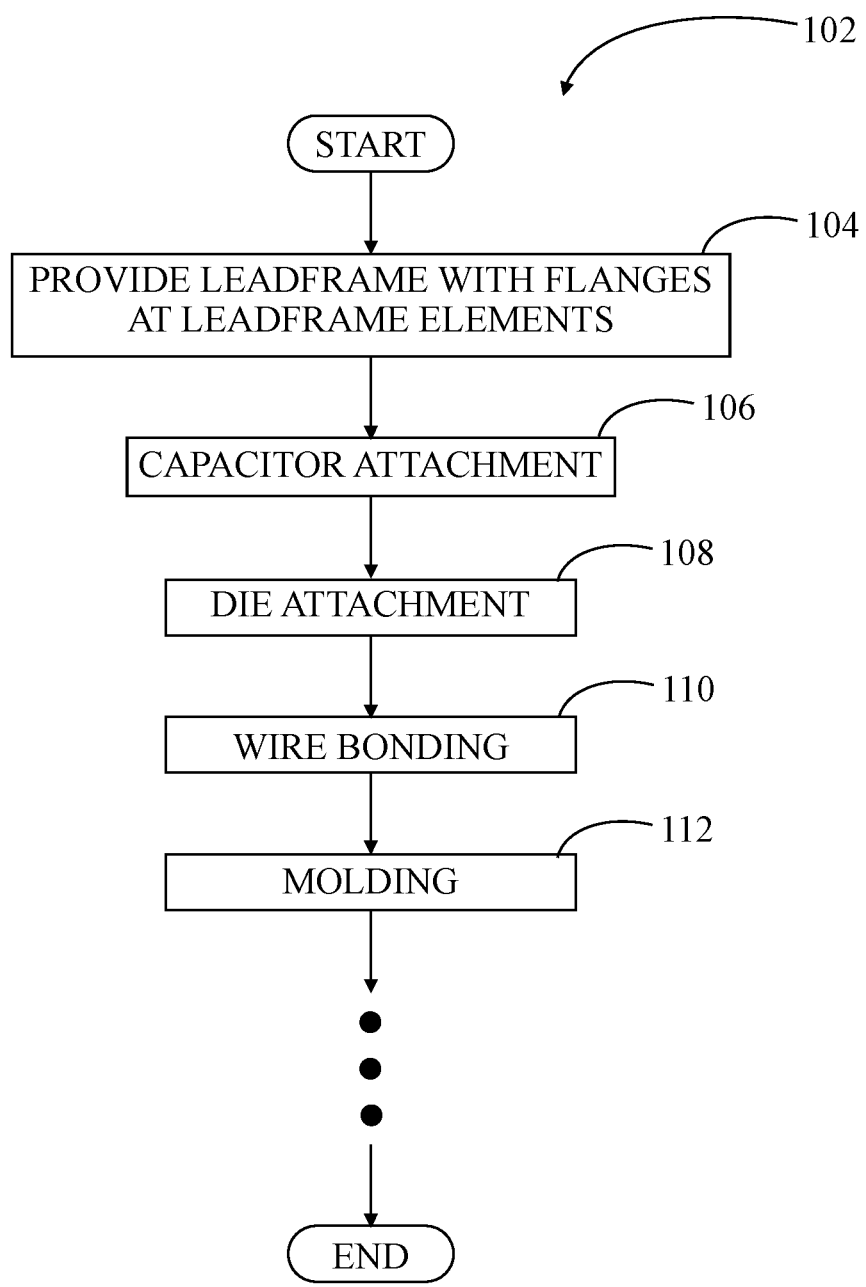

ELECTRONIC DEVICE, DEVICE PACKAGE, AND METHOD OF FABRICATION

TECHNICAL FIELD OF THE INVENTION

The present invention relates generally to semiconductor device packaging. More specifically, the present invention relates to a leadframe structure and methodology for secure attachment of electronic components to enable improvements in quality control and reliability of a packaged semiconductor device.

BACKGROUND OF THE INVENTION

The electronics industry continues to rely upon advances in semiconductor technology to realize higher-function devices in more compact areas. These higher-function devices have to survive the stresses incurred during manufacturing and those stresses imposed by their ultimate application by the end user.

SUMMARY

Aspects of the disclosure are defined in the accompanying claims.

In a first aspect, there is provided a device comprising a leadframe. The leadframe includes a first leadframe element having a first surface; a second leadframe element adjacent to the first leadframe element, the first and second leadframe elements being separate from one another, the second leadframe element having a second surface; a first flange extending from a first outer edge of the first leadframe element and extending away from the first surface of the first leadframe element; and a second flange extending from a second outer edge of the second leadframe element and extending away from the second surface of the second leadframe element. The device further includes an electronic component coupled to the first and second surfaces of the first and second leadframe elements such that the first and second flanges are located at opposing first and second sidewalls of the electronic component.

In a second aspect, there is provided method comprising providing a leadframe having a first leadframe element and a second leadframe element adjacent to the first leadframe element, the first and second leadframe elements being separate from one another, the first leadframe element having a first surface and the second leadframe element having a second surface; providing a first flange extending from a first outer edge of the first leadframe element and extending away from the first surface of the first leadframe element; providing a second flange extending from a second outer edge of the second leadframe element and extending away from the second surface of the second leadframe element; and coupling an electronic component to the first and second surfaces of the first and second leadframe elements such that the first and second flanges are located at opposing first and second sidewalls of the electronic component In a third aspect, there is provided device comprising a leadframe. The leadframe includes a first leadframe element having a first surface; a second leadframe element adjacent to the first leadframe element, the first and second leadframe elements being separate from one another, the second leadframe element having a second surface; a first flange extending from a first outer edge of the first leadframe element and extending away from the first surface of the first leadframe element, the first flange having a first portion coupled to the first outer edge of the first leadframe element and a second portion having a third surface, the third surface being nonparallel to the first surface of the first leadframe element; and a second flange extending from a second outer edge of the second leadframe element and extending away from the second surface of the second leadframe element, the second flange having a third portion coupled to the second outer edge of the second leadframe element and a fourth portion having a fourth surface, the fourth surface being nonparallel to the second surface of the second leadframe element. The device further includes an electronic component coupled to the first and second surfaces of the first and second leadframe elements such that the first and second portions of the first and second flanges are located at opposing first and second sidewalls of the electronic component, wherein the electronic component is coupled to the first and second surfaces of the first and second leadframe elements by an adhesive layer.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

FIG. 5 shows a flowchart of a method of fabricating the packaged device of FIG. 4; and

DETAILED DESCRIPTION

In overview, the present disclosure concerns a device and a method of fabrication. More particularly, a device includes a leadframe upon which one or more electronic devices (e.g., passive devices such as capacitors) and one or more semiconductor dies may be attached). The electronic device, e.g., capacitor, may be attached to and span across a gap between a pair of leadframe elements utilizing a glue adhesive. The leadframe design includes flange structures that increase an attachment area for the electronic device to enable improvements in quality control and device reliability.

The instant disclosure is provided to further explain in an enabling fashion at least one embodiment in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish different elements.

Figure 1:
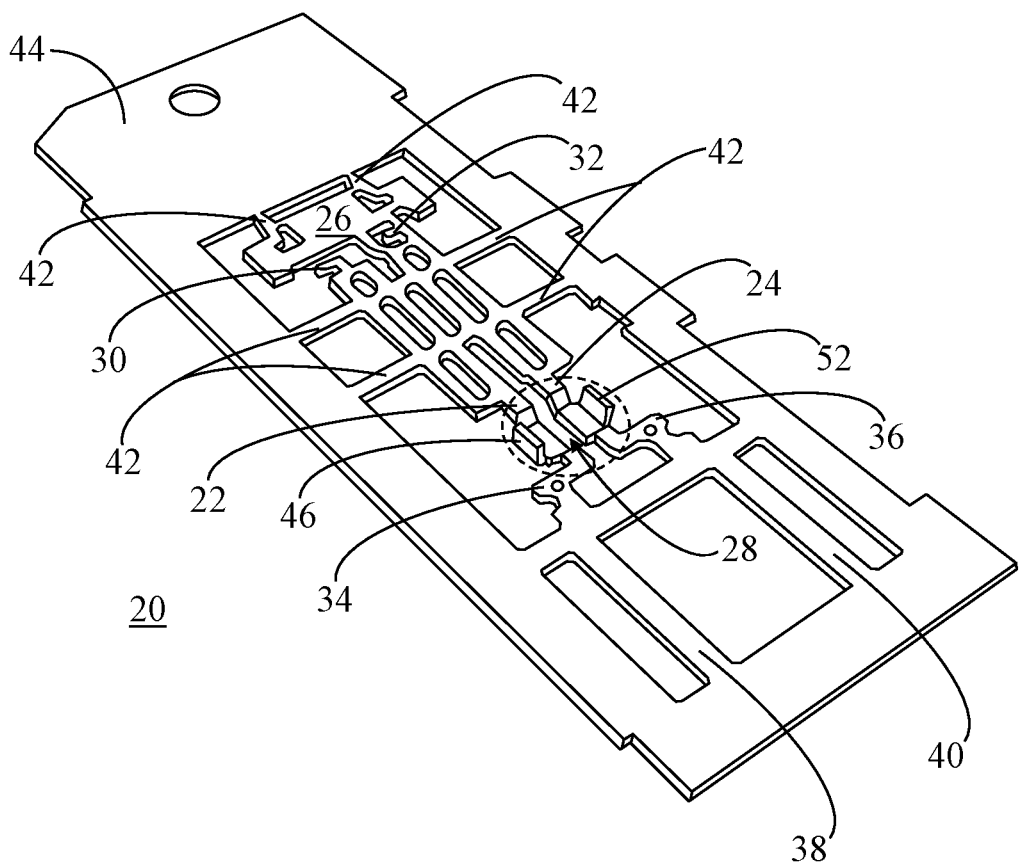
FIG. 1 shows a perspective view of a leadframe in accordance with an embodiment.
Figure 2:
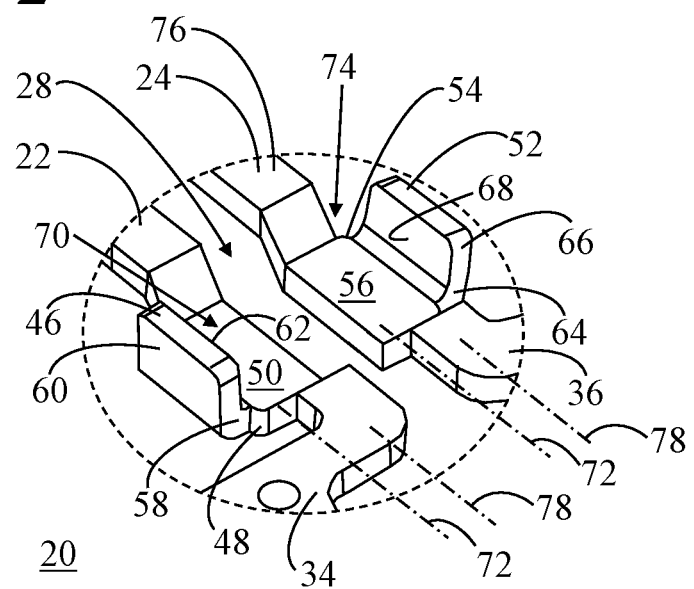
FIG. 2 shows an enlarged perspective view of a portion of the leadframe.

Referring to FIGS. 1 and 2, FIG. 1 shows a perspective view of a leadframe 20 in accordance with an embodiment and FIG. 2 shows an enlarged perspective view of a portion of leadframe 20. More particularly, the portion of leadframe 20 shown in FIG. 2 represents the dashed circular area shown in FIG. 1. Leadframe 20 includes a first leadframe element 22, a second leadframe element 24, and a die pad 26. First and second leadframe elements 22, 24 are separated from one another by a gap 28. First leadframe element 22 has a first proximal end 30 near, but spaced apart from, die pad 26. Second leadframe element 24 has a second proximal end 32 that is physically connected to die pad 26. First and second leadframe elements 22, 24 further include respective first and second distal ends 34, 36. First distal end 34 is electrically connected to a first lead 38 and second distal end 36 is electrically connected to a second lead 40.

In this illustration, tie bars 42 interconnect first and second leadframe elements 22, 24, die pad 26, and first and second leads 38, 40 to a surrounding frame structure 44. Tie bars 42 and frame structure 44 provide support for first and second leadframe elements 22, 24, die pad 26, and first and second leads 38, 40 while leadframe 20 undergoes further processing, as will be described in further detail below. However, in a final packaged structure (discussed in connection with FIG. 4) tie bars 42 and frame structure 44 will be cut or otherwise removed. Only one leadframe 20 is shown for simplicity. In a fabrication application, multiple leadframes 20 may be connected as a sheet of leadframes that will eventually be separated into individual leadframes 20. Additionally, leadframe 20 may be a conventional metal configuration or any other suitable material for use in microelectronic packages.

With particular reference to the enlarged view of FIG. 2, a first flange 46 extends from a first outer edge 48 of first leadframe element 22 and away from a first surface 50 of first leadframe element 22. Similarly, a second flange 52 extends from a second outer edge 54 of second leadframe element 24 and away from a second surface 56 of second leadframe element 24. In some embodiments, first flange 46 has a first portion 58 coupled to first outer edge 48 of first leadframe element 22 and a second portion 60 having a third surface 62, in which third surface 62 is nonparallel to first surface 50 of first leadframe element 22. Likewise, second flange 52 has a third portion 64 coupled to second outer edge 54 of second leadframe element 24 and a fourth portion 66 having a fourth surface 68, in which fourth surface 68 is nonparallel to second surface 56 of second leadframe element 24.

In some embodiments, third surface 62 may be perpendicular to first surface 50, thus forming a 90° angle between first and third surfaces 50, 62. Likewise, fourth surface 68 may be perpendicular to second surface 56, thus forming a 90° angle between second and fourth surfaces 56, 68. In other embodiments, the angles may be less than 90° or greater than 90°.

With continued reference to the enlarged view of FIG. 2, a first recessed region 70 of first leadframe element 22 is formed in a first plane 72. A second recessed region 74 of second leadframe element 24 is also formed in first plane 72. However, a remainder 76 of leadframe 20 is formed in a second plane 78 generally parallel to and displaced away from first plane 72. First flange 46 extends from first outer edge 48 of first recessed region 70 of first leadframe element 22 toward second plane 78 of remainder 76 of leadframe 20. Likewise, second flange 52 extends from second outer edge 54 of second recessed region 74 of second leadframe element 24 toward second plane 78 of remainder of leadframe 20. First and second recessed regions 70, 74 are sized to facilitate secure attachment of an electronic component (discussed below) to both of first and second leadframe elements 22, 24 within first and second recessed regions 70, 74 utilizing an adhesive glue (discussed below).

Leadframe 20 having first and second flanges 46, 52 and first and second recessed regions 70, 74 may be formed using any suitable etch or stamp leadframe manufacturing process. Furthermore, leadframe 20 may be any suitable thickness and have any suitable surface roughness. Additionally, leadframe 20 may be coated or plated with a variety of materials and the coating/plating may be any suitable thickness.

Figure 3:
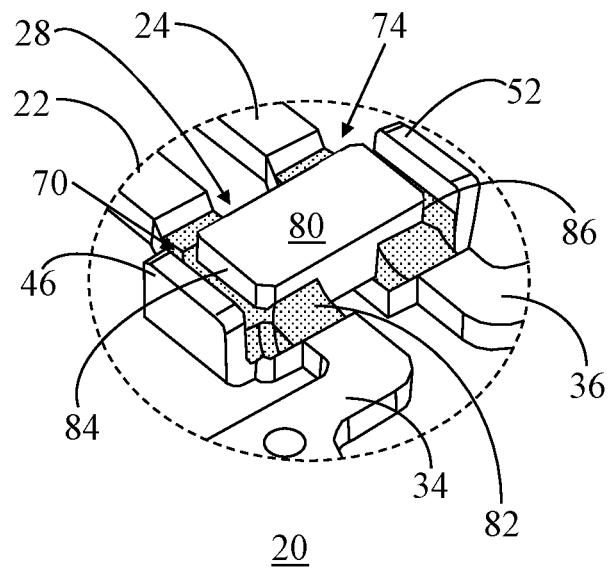
FIG. 3 shows the enlarged perspective view of the portion of the leadframe having an electronic component coupled to leadframe elements of the leadframe.

FIG. 3 shows the enlarged perspective view of the portion of the leadframe 20 having an electronic component 80 coupled to first and second leadframe elements 22, 24 of leadframe 20. Electronic component 80 is coupled to first and second leadframe elements 22, 24 and spans gap 28. Electronic component 80 may be any suitable passive or an active component. Examples of passive devices include, but are not limited to, capacitors, ferrite blocks, resistors, inductors, and the like. Examples of active devices include, but are not limited to, dies, stacked dies, sensors, integrated circuits, and the like. In some embodiments, electronic component 80 may be a capacitor. A capacitor may be interconnected between first and second leadframe elements 22, 24 to provide immunity to, for example, electromagnetic disturbances.

As shown, electronic component 80 is positioned in first and second recessed regions 70, 74 of corresponding first and second leadframe elements 22, 24. Electronic component 80 is coupled to first and second surfaces 50, 56 (FIG. 2) of first and second leadframe elements 22, 24 by an adhesive layer 82. Electronic component 80 is coupled to first and second surfaces 50, 56 of first and second leadframe elements 22, 24 such that first and second flanges 46, 52 are located at opposing first and second sidewalls 84, 86 of electronic component.

Adhesive layer 82 (represented by a stippled pattern) may be electrically conductive or electrically insulative depending upon the application. Adhesive layer 82 may bond by evaporation of a solvent or by curing a bonding agent with parameters such as heat, pressure, and time. By way of example but not to be construed as limiting, adhesive layer 82 may be a polymer adhesive glue. In other examples, adhesive layer 82 may be a die attach film. In one cost effective and readily automated process, adhesive layer 82, in the form of an adhesive glue, may be applied to first and second surfaces 50, 56 by dispensing the adhesive glue through a tool.

In previous structures and associated methodologies that include a generally flat leadframe and that utilize an adhesive glue to couple an electronic component (e.g., a capacitor) to the leadframe suffer from the glue cracking and lifting during handling processes or stress testing. In some instances, the electronic component can become fully delaminated from the leadframe leading to device failure. The possible causes for cracking and delamination may be vibration during handling and/or the glue may provide an insufficient fillet to maintain attachment between the electronic component and the leadframe. This can cause device package failure.

The presence of first and second flanges 46, 52 at first and second recessed regions 70, 74 effectively increases the attachment surface area between electronic device 80 and adhesive layer 82 relative to the surface area of prior art generally flat leadframes. That is, first and second flanges 46, 52 at first and second leadframe elements 22, 24 may effectively support glue adhesive 82 and electronic device 80 to resist cracking and/or delamination from handling vibrations and stress testing to thereby enable improvements in quality control and device reliability.

Figure 4:
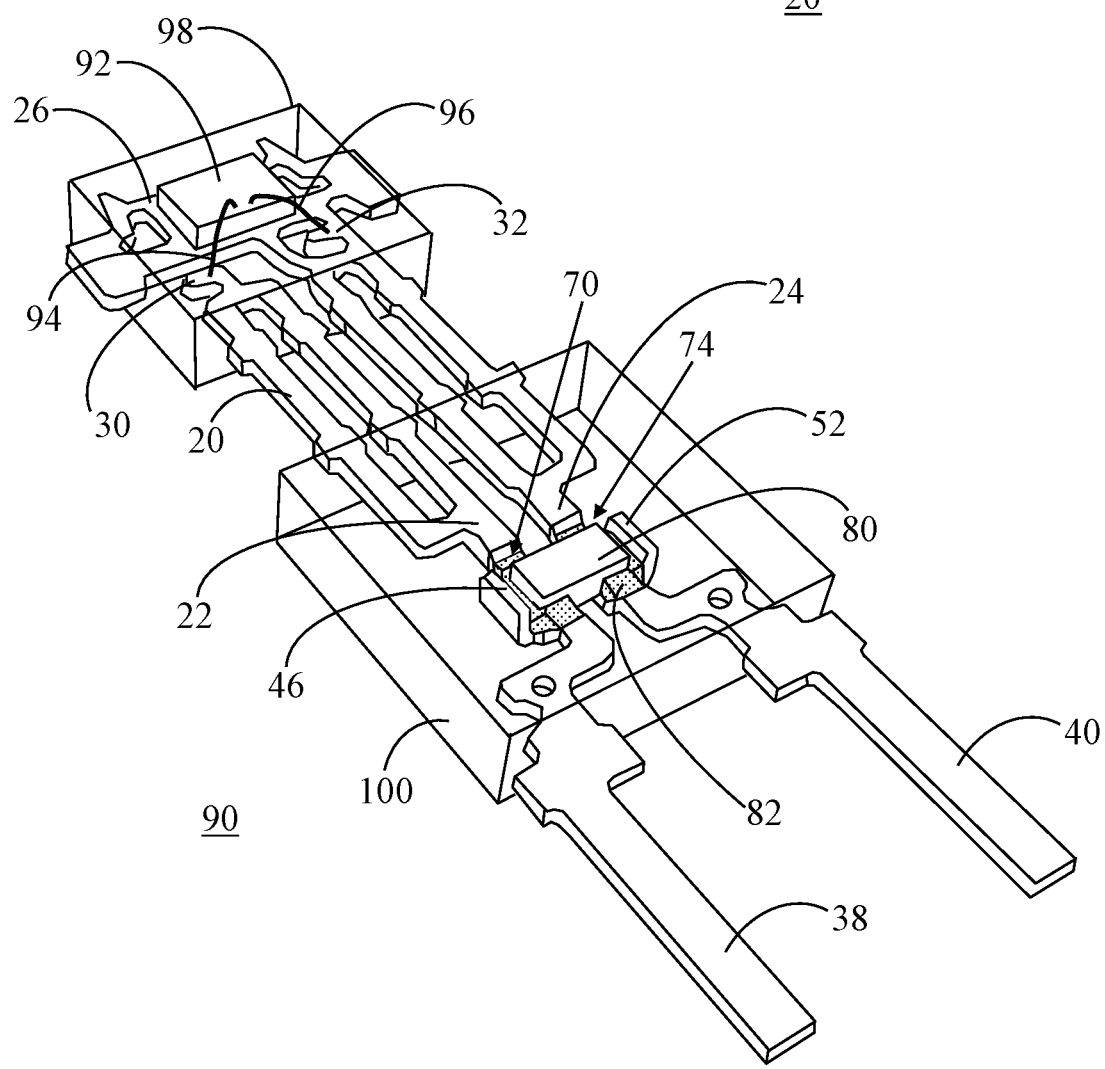
FIG. 4 shows a perspective view of a packaged device that includes the leadframe of FIG. 1.

FIG. 4 shows a perspective view of a packaged device 90 that includes leadframe 20. Device 90 includes a die 92 coupled to die pad 26 of leadframe 20, electronic component 80 coupled to first and second leadframe elements 22, 24 at first and second recessed regions 70, 74, and first and second bondwires 94, 96. A first encapsulating element 98 encapsulates die 92 and first and second bondwires 94, 96 and a second encapsulating element 100 encapsulates first and second recessed regions 70, 74 of first and second leadframe elements 22, 24 and electronic component 80. First and second encapsulating elements 98, 100 are shown in outline form so that the elements inside each of first and second encapsulating elements 98, 100 may be visualized.

Die 92 may be a sensor, such as a magnetic field sensor (e.g., a Hall sensor, a magnetoresistive sensor, or any other sensor). When die 92 is a magnetic field sensor, electronic component 80 may be a capacitor for providing immunity to electromagnetic disturbances. Die 92 may also include an integrated circuit and a readout circuit for the sensor. Alternatively, die 92 may be any other type of sensor or any other type of integrated circuit. Die 92 is supported by die pad 26 and a further component (not shown) may be attached to a second, opposite surface of die pad 26 or to an exterior surface of first encapsulating element 98. Die 92 includes bondpads (not visible) for making electrical connections to die 92. First bondwire 94 connects to one of the bondpads on die 92 and to first proximal end 30 of first leadframe element 22. Second bondwire 96 connects to another one of the bondpads on die 92 and to second proximal end 32 of second leadframe element 24.

First encapsulating element 98 fully surrounds die 92, die pad 26, and first and second bondwires 94, 96. Similarly, second encapsulating element 100 fully surrounds first and second recessed regions 70, 74 of first and second leadframe elements 22, 24 and electronic component 80. First and second encapsulating elements 98, 100 may be formed from a polymeric material, such as a plastic material, and may be overmolded over the components that they surround. Packaged device 90 shows two encapsulating elements 98, 100. In other configurations, all of the components of a packaged device may be encapsulated in a single encapsulating element.

First and second leadframe elements 22, 24 both protrude from the same sidewall of first encapsulating element 98 and enter at the same sidewall of second encapsulating element 100. First and second leads 38, 40 both protrude from another sidewall of second encapsulating element 100 and extend away in finger-like elongate protrusions. First and second leads 38, 40 may serve as electrical connectors that are suitable for connecting to a plug or socket.

When packaged device 90 is subject to handling vibrations and/or stress testing, the presence of first and second flanges 46, 52 at first and second recessed regions 70, 74 of the first and second leadframe elements 22, 24 may enable packaged device 90 to resist cracking and/or delamination by effectively increasing the attachment surface area between electronic device 80 and adhesive layer 82 relative to the surface area of prior art generally flat leadframes. Accordingly, improved quality control and reliability of packaged device 90 may be achieved.

FIG. 5 shows a flowchart of a fabrication process 102 for fabricating packaged device 90 (FIG. 4). Accordingly, reference may be made concurrently to FIGS. 1-4 in conjunction with the following description.

At a first block 104, leadframe 20 is provided. Leadframe 20 is preferably one of a strip of identical leadframes. As such, the following discussion applies equivalently to the provision of multiple leadframes 20. Leadframe 20 is provided or otherwise formed to include first leadframe element 22 and second leadframe element 24 adjacent to, but separated from, first leadframe element 22 by gap 28 as described above, first flange 46 extending from first outer edge 48 of first leadframe element 22 and extending away from first surface 50 of first leadframe element 22, and second flange 52 extending from second outer edge 54 of second leadframe element 24 and extending away from second surface 56 of second leadframe element 24. Additionally, leadframe 20 is provided or otherwise formed to include die pad 26 and first and second leads 38, 40.

As previously discussed, first flange 46 may be bent or stamped such that first portion 58 of first flange 46 is coupled to first outer edge 48 of first leadframe element 22 and second portion 60 of first flange 46 is oriented such that third surface 62 of second portion 60 is nonparallel to first surface 50 of first leadframe element 22. Likewise, second flange 52 may be bent or stamped such that third portion 64 of second flange 52 is coupled to second outer edge 54 of second leadframe element 24 and fourth portion 66 of second flange 52 is oriented such that fourth surface 68 of fourth portion 66 is nonparallel to second surface 56 of second leadframe element 24.

As further discussed previously, first recessed region 70 of first leadframe element 22 may be formed in first plane 72, second recessed region 74 of second leadframe element 24 may be formed in first plane, and the remainder 76 of leadframe 20 may be formed in second plane 78 parallel to and displaced away from first plane 72. Thus, first flange 46 is formed at first recessed region 70 of first leadframe element 22 such that first flange 46 extends from first outer edge 48 of first recessed region 70 toward second plane 78 of remainder 76 of leadframe 20. Likewise, second flange 52 is formed at second recessed region 74 of second leadframe element 24 such that second flange 52 extends from second outer edge 54 of second recessed region 74 toward second plane 78 of remainder 76 of leadframe 20.

At block 104, leadframe 20 may be provided with tie bars 42, frame structure 44, dam bars (not shown), or any other suitable temporary connection structures leadframe 20. Additionally, leadframe 20 may be coated or plated with a variety of materials and the coating/plating may be any suitable thickness. It will be understood that leadframe 20 may be received from a leadframe supplier. Alternatively, a plurality of leadframes 20 may be formed in a strip or array by a manufacturer of packaged device 20.

At a block 106, electronic component 80 (e.g., a passive device, such as a capacitor) is coupled to first and second surfaces 50, 56 of first and second leadframe elements 22, 24 such that first and second flanges 46, 52 are located at opposing first and second sidewalls 84, 86 of electronic component 80. As discussed previously, electronic component 80 may be adhered to first and second surfaces 50, 56 at first and second recessed regions 70, 74 with adhesive layer 82, which may be an adhesive glue. Thus, electronic component 80 is positioned to extend across gap 28 separating first and second leadframe elements 22, 24.

At a block 108, die 92 is attached to die pad 26 of leadframe 20. Die 92 may be attached to die pad 26 with a die attach adhesive. At a block 110, bondpads on die 92 are electrically connected to first and second proximal ends 30, 32, such as with first and second bondwires 94, 96.

At a block 112, die pad 26, die 92, and bondwires 94, 96 are encapsulated with a molding compound to form first encapsulating element 98 and electronic component 80 and first and second recessed regions 70, 74 of first and second leadframe elements 22, 24 are encapsulated with a molding compound to form second encapsulating element 100.

Fabrication process 102 may continue with a number of ensuing fabrication blocks as denoted by ellipses. These fabrication blocks may entail cutting dam bars, uniquely marking the packaged devices 90, singulation to form individual packaged devices 90, inspection, test, packing, and the like.

Embodiments described herein entail a device and a method of fabrication. More particularly, the device includes a leadframe upon which one or more electronic devices (e.g., passive devices such as capacitors) and one or more semiconductor dies may be attached). The electronic device, e.g., capacitor, may be attached to and span across a gap between a pair of leadframe elements utilizing a glue adhesive. The leadframe design includes flange structures that increase an attachment area for the electronic device to enable improvements in quality control and device reliability.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A device comprising:
a leadframe, the leadframe including:
   a first leadframe element having a first surface and a first end;
   a second leadframe element adjacent to the first leadframe element, the first and second leadframe elements being separate from one another, the second leadframe element having a second surface and a second end;
   a first flange extending from a first outer edge of the first leadframe element and extending away from the first surface of the first leadframe element;
   a second flange extending from a second outer edge of the second leadframe element and extending away from the second surface of the second leadframe element; and
   a die pad formed proximate the first and second ends of the first and second leadframe elements; and
an electronic component coupled to the first and second surfaces of the first and second leadframe elements such that the first and second flanges are located at opposing first and second sidewalls of the electronic component.

2. A device comprising:
a leadframe, the leadframe including:
   a first leadframe element having a first surface;
   a second leadframe element adjacent to the first leadframe element, the first and second leadframe elements being separate from one another, the second leadframe element having a second surface;
   a first flange extending from a first outer edge of the first leadframe element and extending away from the first surface of the first leadframe element, wherein the first flange has a first portion coupled to the first outer edge of the first leadframe element and a second portion having a third surface, the third surface being nonparallel to the first surface of the first leadframe element; and
   a second flange extending from a second outer edge of the second leadframe element and extending away from the second surface of the second leadframe element, wherein the second flange has a third portion coupled to the second outer edge of the second leadframe element and a fourth portion having a fourth surface, the fourth surface being nonparallel to the second surface of the second leadframe element; and
an electronic component coupled to the first and second surfaces of the first and second leadframe elements such that the first and second flanges are located at opposing first and second sidewalls of the electronic component.

3. The device of claim 2 wherein:
the third surface is perpendicular to the first surface; and
the fourth surface is perpendicular to the second surface.

4. A device comprising:
a leadframe, the leadframe including:
   a first leadframe element having a first surface;
   a second leadframe element adjacent to the first leadframe element, the first and second leadframe elements being separate from one another, the second leadframe element having a second surface;
   a first flange extending from a first outer edge of the first leadframe element and extending away from the first surface of the first leadframe element and
   a second flange extending from a second outer edge of the second leadframe element and extending away from the second surface of the second leadframe element, wherein:
      a first recessed region of the first leadframe element is formed in a first plane;
      a second recessed region of the second leadframe element is formed in the first plane; and
      a remainder of the leadframe is formed in a second plane parallel to and displaced away from the first plane, wherein the first flange extends from the first outer edge of the first recessed region of the first leadframe element toward the second plane of the remainder of the leadframe and the second flange extends from the second outer edge of the second recessed region of the second leadframe element toward the second plane of the remainder of the leadframe; and
an electronic component coupled to the first and second surfaces of the first and second leadframe elements such that the first and second flanges are located at opposing first and second sidewalls of the electronic component.

5. The device of claim 1 wherein the electronic component is coupled to the first and second surfaces of the first and second leadframe elements by an adhesive layer.

6. The device of claim 1 wherein the electronic component extends across a gap separating the first and second leadframe elements.

7. The device of claim 1 further comprising a die coupled to the die pad.

8. The device of claim 1 wherein the electronic component is a passive device.

9. The device of claim 1 wherein the electronic component is a capacitor.

10. A method comprising:
providing a leadframe having a first leadframe element and a second leadframe adjacent to the first leadframe element, the first and second leadframe elements being separate from one another, the first leadframe element having a first surface and the second leadframe element having a second surface, wherein the providing the leadframe comprises providing a die pad positioned proximate first and second ends of the first and second leadframe elements;
providing a first flange extending from a first outer edge of the first leadframe element and extending away from the first surface of the first leadframe element;
providing a second flange extending from a second outer edge of the second leadframe element and extending away from the second surface of the second leadframe element;
coupling an electronic component to the first and second surfaces of the first and second leadframe elements such that the first and second flanges are located at opposing first and second sidewalls of the electronic component;
coupling a die to the die pad;
bonding one or more wires between the die and the first and second ends of the first and second leadframe elements; and
forming a molding compound on the leadframe, the electronic component, the die, the one or more wires, and the first and second leadframe elements to produce a packaged device.

11. The method of claim 10 wherein:
the providing the first flange comprises bending the first flange such that a first portion of the first flange is coupled to the first outer edge of the first leadframe element and a second portion of the first flange is oriented such that a third surface of the second portion is nonparallel to the first surface of the first leadframe element; and
the providing the second flange comprises bending the second flange such that a third portion of the second flange is coupled to the second outer edge of the second leadframe element and a fourth portion of the second flange is oriented such that a fourth surface of the fourth portion is nonparallel to the second surface of the second leadframe element.

12. The method of claim 10 wherein:
the providing the leadframe comprises:
providing a first recessed region of the first leadframe element in a first plane;
providing a second recessed region of the second leadframe element in the first plane; and
providing a remainder of the leadframe in a second plane parallel to and displaced away from the first plane;
the providing the first flange comprises providing the first flange at the first recessed region of the first leadframe element such that first flange extends from the first outer edge of the first recessed region of the first leadframe element toward the second plane of the remainder of the leadframe; and
the providing the second flange comprises providing the second flange at the second recessed region of the second leadframe element such that the second flange extends from the second outer edge of the second recessed region of the second leadframe element toward the second plane of the remainder of the leadframe.

13. The method of claim 10 wherein the coupling the electronic component comprises adhering the electronic component to the first and second surfaces of the first and second leadframe elements with an adhesive layer.

14. The method of claim 10 wherein the coupling the electronic component comprises positioning the electronic component to extend across a gap separating the first and second leadframe elements.

15. A device comprising:
a leadframe, the leadframe including:
a first leadframe element having a first surface;
a second leadframe element adjacent to the first leadframe element, the first and second leadframe elements being separate from one another, the second leadframe element having a second surface;
a first flange extending from a first outer edge of the first leadframe element and extending away from the first surface of the first leadframe element, the first flange having a first portion coupled to the first outer edge of the first leadframe element and a second portion having a third surface, the third surface being nonparallel to the first surface of the first leadframe element; and
a second flange extending from a second outer edge of the second leadframe element and extending away from the second surface of the second leadframe element, the second flange having a third portion coupled to the second outer edge of the second leadframe element and a fourth portion having a fourth surface, the fourth surface being nonparallel to the second surface of the second leadframe element; and
an electronic component coupled to the first and second surfaces of the first and second leadframe elements such that the first and second portions of the first and second flanges are located at opposing first and second sidewalls of the electronic component, wherein the electronic component is coupled to the first and second surfaces of the first and second leadframe elements by an adhesive layer.

16. The device of claim 15 wherein:
a first recessed region of the first leadframe element is formed in a first plane;
a second recessed region of the second leadframe element is formed in the first plane; and
a remainder of the leadframe is formed in a second plane parallel to and displaced away from the first plane, wherein the first flange extends from the first outer edge of the first recessed region of the first leadframe element toward the second plane of the remainder of the leadframe and the second flange extends from the second outer edge of the second recessed region of the second leadframe element toward the second plane of the remainder of the leadframe.

17. The device of claim 15 wherein the electronic component extends across a gap separating the first and second leadframe elements.

18. The device of claim 15 wherein:
the first leadframe element has a first end;
the second leadframe element has a second end;
the leadframe further comprises a die pad positioned proximate the first and second ends of the first and second leadframe elements; and
the device further comprises a die coupled to the die pad.

* * * * *